United States Patent
Kim et al.

(10) Patent No.: US 6,776,688 B2
(45) Date of Patent: Aug. 17, 2004

(54) REAL-TIME POLISHING PAD STIFFNESS-CONTROL USING MAGNETICALLY CONTROLLABLE FLUID

(75) Inventors: Andrew T. Kim, Plano, TX (US); Christopher L. Borst, Plano, TX (US); Matthew W. Losey, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 17 days.

(21) Appl. No.: 10/274,082

(22) Filed: Oct. 21, 2002

(65) Prior Publication Data

US 2004/0077292 A1 Apr. 22, 2004

(51) Int. Cl.⁷ ............................................. B24B 31/112
(52) U.S. Cl. ................. 451/5; 451/35; 451/74; 451/104; 451/106; 451/113; 451/114; 451/285; 15/102; 438/691; 216/88; 156/345
(58) Field of Search ................................ 451/5, 35, 36, 451/32, 41, 74, 104, 106, 113, 114, 285–290; 15/97.1, 102, 230; 438/693, 691, 692; 216/88, 89; 156/345

(56) References Cited

U.S. PATENT DOCUMENTS

| | | | | |
|---|---|---|---|---|
| 5,577,948 A | * | 11/1996 | Kordonsky et al. | 451/35 |
| 5,895,550 A | * | 4/1999 | Andreas | 156/345.12 |
| 5,899,799 A | * | 5/1999 | Tjaden et al. | 451/287 |
| 6,059,636 A | * | 5/2000 | Inaba et al. | 451/5 |
| 6,297,159 B1 | * | 10/2001 | Paton | 438/693 |
| 6,482,077 B1 | * | 11/2002 | Doan et al. | 451/41 |

* cited by examiner

Primary Examiner—Joseph J. Hail, III
Assistant Examiner—Anthony Ojini
(74) Attorney, Agent, or Firm—W. James Brady, III; Frederick J. Telecky, Jr.

(57) ABSTRACT

A method of CMP polishing of a semiconductor wafer is described that includes using a polishing pad on a platen/table with the polishing pad including a sub-pad containing pockets of magnetorheological fluid. The stiffness of the sub-pad is controlled by selectively applying a magnetic field at selective pockets containing magnetorheological fluid to change the viscosity of the magnetorheological fluid. The changing stiffness increases the polishing rate of the pad in the areas of the magnetic field.

16 Claims, 4 Drawing Sheets

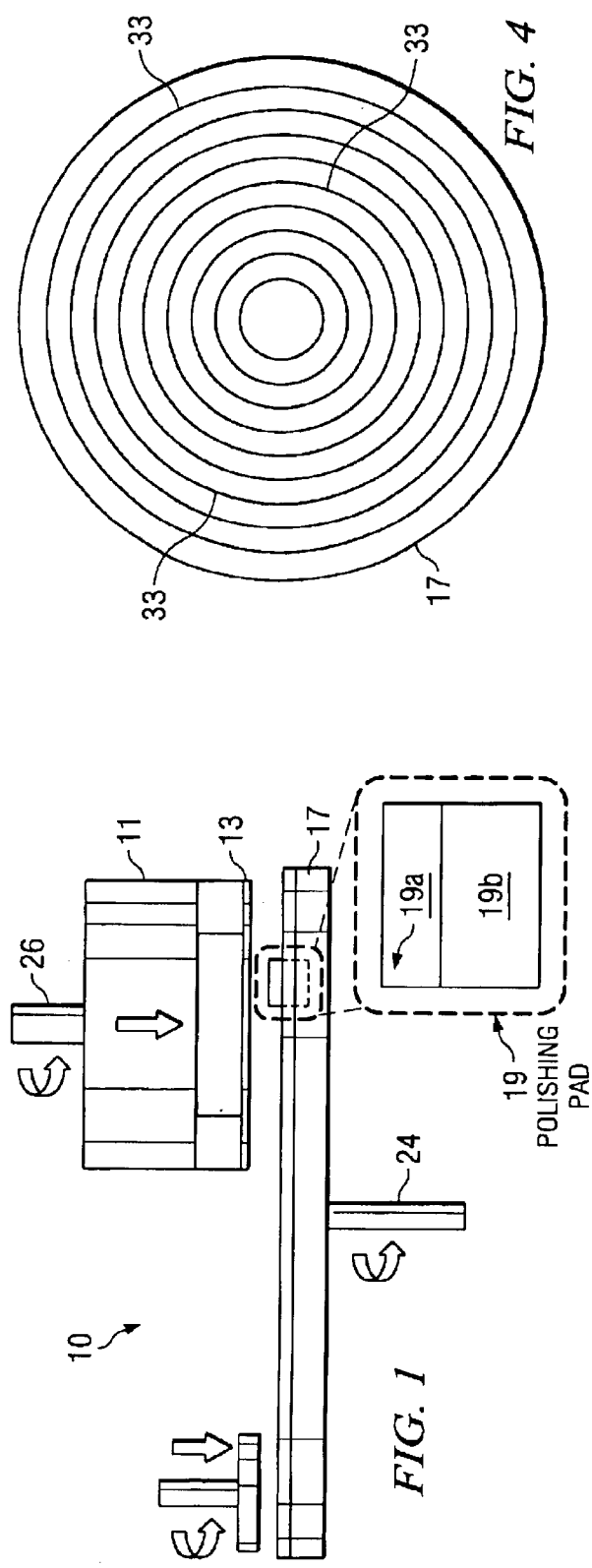
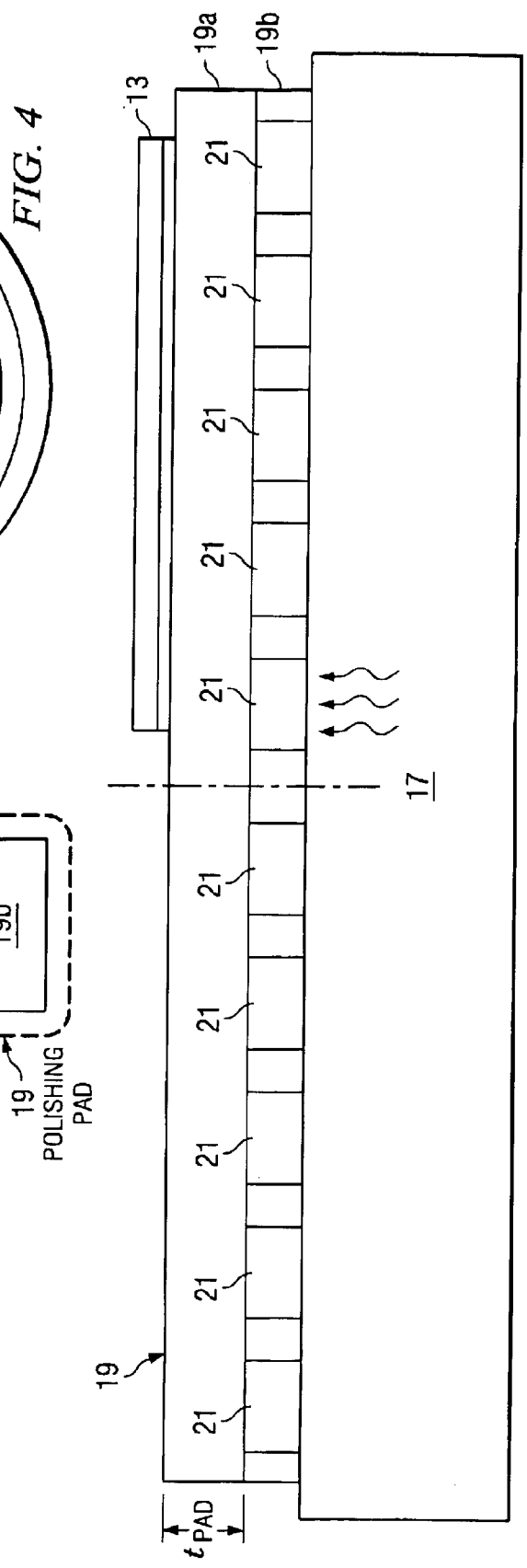

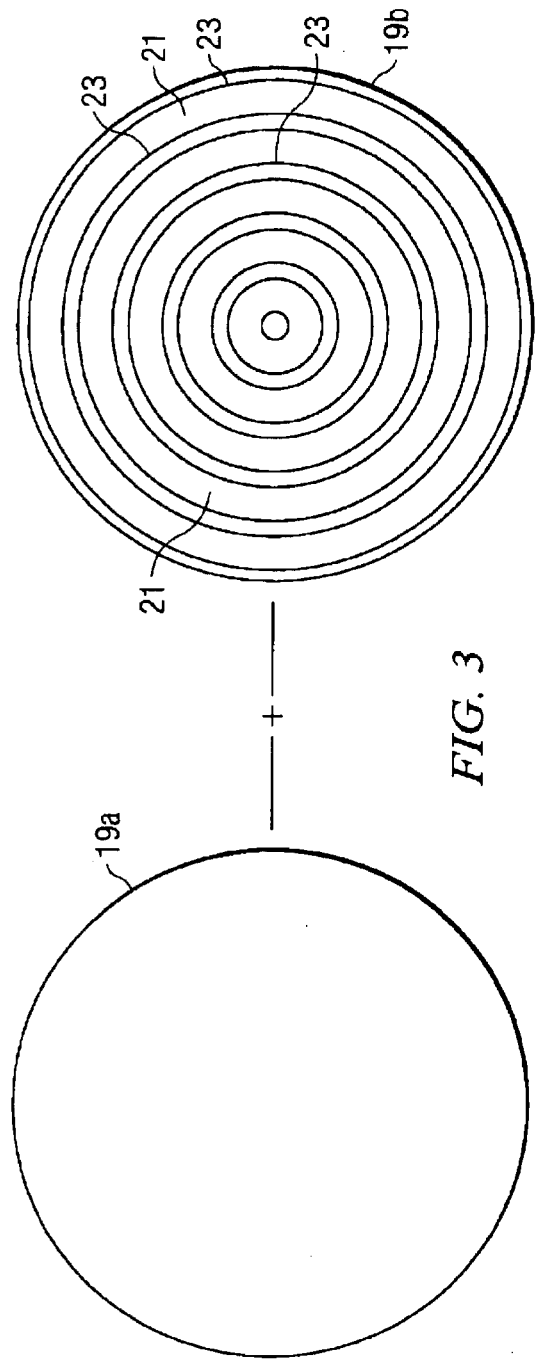
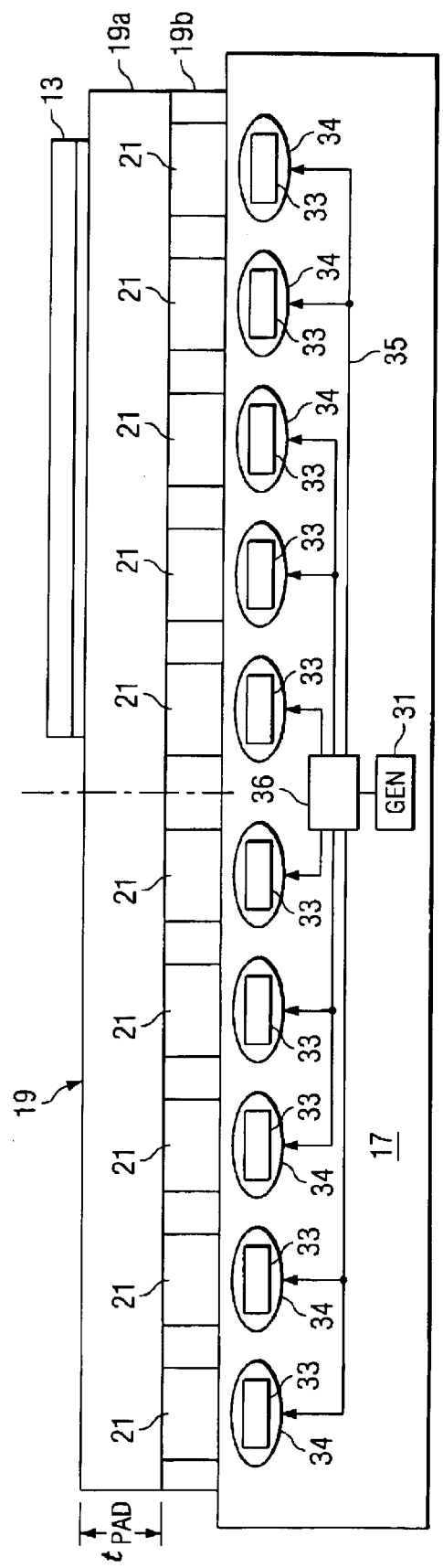
FIG. 3
FIG. 5

REAL-TIME POLISHING PAD STIFFNESS-CONTROL USING MAGNETICALLY CONTROLLABLE FLUID

FIELD OF INVENTION

This invention relates to semiconductor processing and more particularly to chemical mechanical planarization (CMP) using polishing pad stiffness control with magnetically controllable fluid that causes a rheology change (a magnetorheological fluid).

BACKGROUND OF INVENTION

In semiconductor device fabrication, silicon wafers, after undergoing a pattern, deposition, etching, etc. process to form electrical devices and circuits on a layer there is coated a layer of glass or oxide that is polished. In the case of adding another layer of devices and circuits an interconnect between layers is provided by forming a hole in the layer of glass or dielectric and filling the hole with copper and polishing off the copper. Chemical-mechanical polishing (CMP) is widely used as a process for achieving global planarization in semiconductor manufacturing. The pattern on the wafers below the top surface makes the polishing rate non-linear. The hills and valleys resulting from the products under the glass oxide make for the non-linear polishing. Differences in Chemical Mechanical Polishing (CMP) pressure and polish pad properties result in removal rate and thickness non-uniformities within-water (WIWNU). Areas of higher pressure or stiffer pad properties result in higher rates and thinner post-CMP thickness in certain areas.

Control of removal rate in specific areas on the wafer is currently very difficult, requiring multi-chamber pressure control to different parts of the wafer. Other solutions require set-up wafers to determine a multi-zone pressure profile for copper removal uniformity.

The prior art includes using varied stiffness sub-pads that provide the same properties throughout the entire pad and the properties are not variable. In another prior art, the pressure profile of the entire pad is changed with an inflatable bladder under the entire platen. It must be tuned with extensive set-up wafers and the properties are not variable across the wafer.

Another prior art method uses pressure-controlled CMP heads. The pressure chambers must be individually calibrated for a given ECD profile incoming to CMP, requiring extensive set-up wafers. There is no in-situ control.

SUMMARY OF INVENTION

In accordance with one embodiment of the present invention a method of polishing includes the steps of providing a pad containing magnetically controllable rheological (magnetorheological) fluid and controlling the stiffness of the pad by applying magnetic field at the magnetorheological fluid.

In accordance with another embodiment of the present invention an improved polishing pad for polishing an object includes a top porous polishing pad portion with asperity surface to aid slurry action and a sub-pad portion having pockets of magnetorheological fluid for causing stiffness control under a magnetic field.

In accordance with another embodiment of the present invention an improved CMP polishing apparatus is providing including a platen/table and a polishing pad on the platen/table; a polishing head for holding an object to be polished and providing pressure of the wafer against the polishing pad on the platen/table. A sub-pad between the polishing pad and the platen/table for providing mechanical support under the polishing pad. The sub-pad contains regions or pockets of magnetorheological fluid about the pad for controlling the stiffness in real time control. A magnetic field generator applies a selective magnetic field to selective regions or pockets of magnetorheological fluid in the sub-pad to control the stiffness of the sub-pad to provide real time control of the polishing of regions of the object being polished.

DESCRIPTION OF DRAWING

FIG. 1 illustrates Cu CMP hardware.

FIG. 2 illustrates a cross section of a pad and sub-pad on a platen/table with MRF fluid in the sub-pad according to one embodiment of the present invention.

FIG. 3 illustrates top pad and sub-pad pockets in concentric rings filled with MRF according to one embodiment of the present invention.

FIG. 4 illustrates a top view of the platen/table in FIGS. 1 and 2 with concentric rings of core material;

FIG. 5 illustrates a cross section of a pad and sub-pad and a platen/table with the platen/table having rings of core material and coils and electrical network for selectively providing a magnetic field to certain ring areas of MRF material according to one embodiment of the present invention;

PREFERRED EMBODIMENT OF THE INVENTION

Figure 6:
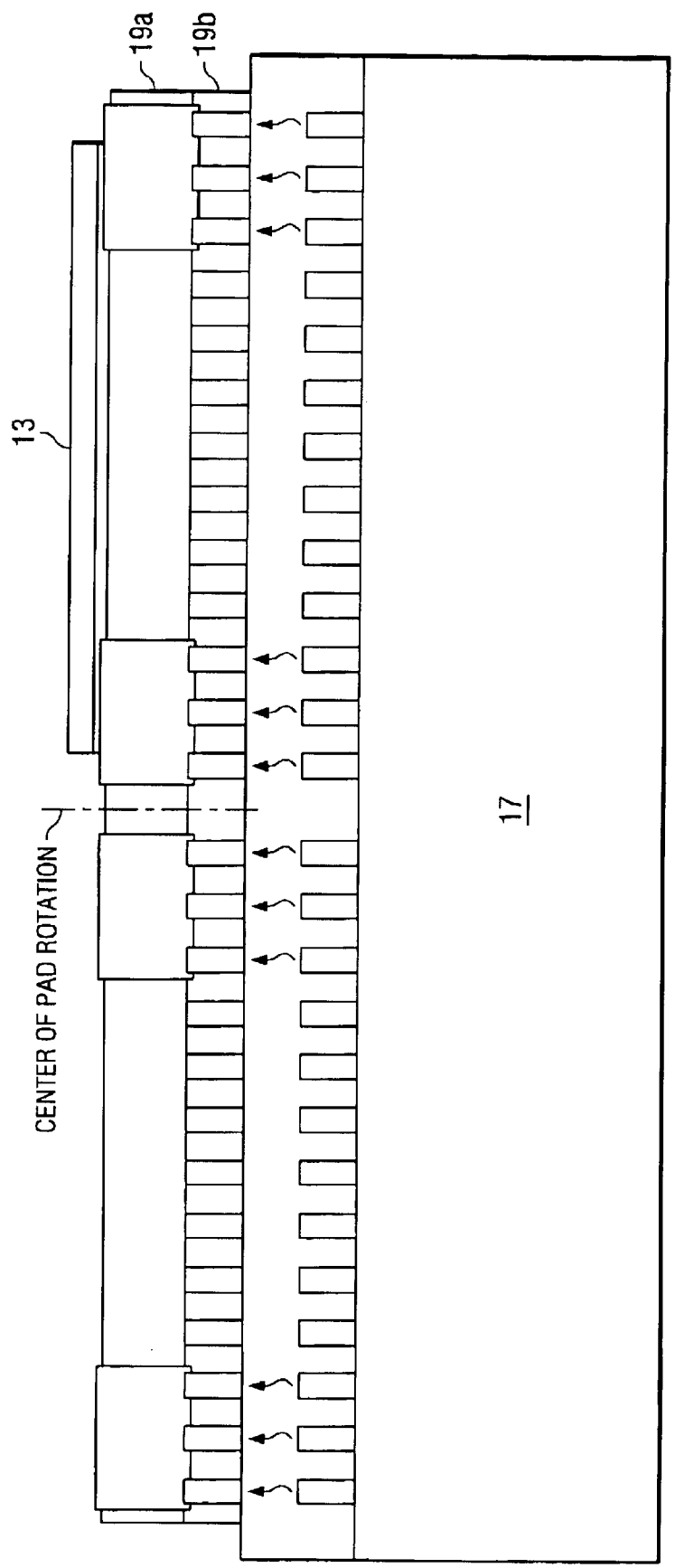
FIG. 6 illustrates selecting the regions of stiffness in the center rings and periphery rings of the pad to increase the wafer edge removal rate.

FIG. 1 illustrates for example a Copper (Cu) CMP polishing hardware 10. In accordance with one embodiment of the present invention an AMAT Mirra CMP polisher 10 is used as illustrated in FIG. 1. The set up comprises a polish head 11 that holds wafer 13 and provides the downward rotating force onto the polishing pad 19. The polishing pad 19 is mounted on a rotating platen or table 17.

The pad 19 comprises a top polishing pad 19a and a sub-pad 19b under top pad 19a for mechanical support. The top polishing pad 19a is a porous polishing pad. The top pad 19a is for example an open cell of foamed polyurethane or a sheet of polyurethane with a concentric circle grooved surface with asperity surface that aids mechanical polishing action and slurry distribution. The top pad 19a material is wetted with a polishing slurry of mostly de-ionized water and some abrasive including, but not limited to aluminum oxide, silicon dioxide, cerium oxide, zirconium oxide, or these particles coated with similar materials using a dispenser positioned above or through the pad. An example of a typical polishing slurry is Cabot Corporation iCue-5001 slurry. The platen/table 17 is rotated about a central axis 24.

The polishing head 11 is rotated about its axis 26 and translated across the surface of the platen 17 by a translation arm (not shown).

In accordance with the present invention the sub-pad 19b contains pockets 21 filled with magnetically controllable rheological (magnetorheological) fluid (MRF) that provides pad stiffness in real time proportional to magnetic filed applied to the fluid.

FIG. 2 illustrates the pockets 21 in the sub-pad. Each of the pockets 21 may be shaped in the form of a concentric ring of different diameter to form concentric rings 23 of pockets 21 as illustrated in FIG. 3. The pad 19 may be an integrated unit of both the grooved top pad 19a and the sub-pad 19b below sealed together with the concentric rings 23 of pockets 21 of magnetorheological fluid (MRF) material sealed within the sub-pad 19b.

The magnetorheological fluid (MRF) material changes its viscosity in the presence of a magnetic field. The magnetorheological fluid (MRF) material goes from a liquid to a solid depending on the strength of an applied magnetic filed. Magnetorheological fluid devices are described for example in U.S. Pat. No. 6,427,813 of Carlson entitled "Magnetorheological Fluid Devices Exhibiting Settling Stability". This patent is incorporated herein by reference. This patent also references other patents describing the magnetorheologocal material which exhibits a thickening behavior (a rheology change), sometimes referred to as an "apparent viscosity change", upon being exposed to a magnetic field of sufficient strength.

In accordance with the present invention a magnetic field 25 is provided at locations on the pad 19 of desired stiffness as illustrated in FIG. 2. The effective pad modulus and effective pad thickness can be controlled in real time as a function of the response time of the magnetorheological fluid (MRF) material and the response time is on the order of milliseconds as represented by the following equation:

$$\sigma_{pad}(x) \sim E^*_{pad}(x) \cdot \lambda_{pad}(x)/t^*_{pad}(x)$$

where $E^*_{pad}$ is the effective modulus of elasticity of the composite structure (pad with MRF), $\sigma_{pad}$ is the pad deformation and $t^*_{pad}$ is the effective pad thickness. As magnetic field is applied, $E^*_{pad}$ increases and $t^*_{pad}$ decreases, resulting in higher contact stress $\sigma_{pad}$, which is a relative measure of material removal rate.

The pad stillness can be controlled at any point across the wafer. It is dependent on the location of the magnetorheological fluid (MRF) material and the method of generating the magnetic field.

In accordance with one embodiment of the present invention illustrated in FIGS. 4 and 5 the platen/table 17 has concentric rings 33 of magnetic core material located therein below and aligned with the rings 23 of magnetorheological fluid (MRF) material in the pad 19b to generate localized magnetic field to the concentric rings 23 of the pockets 21 in the sub-pad 19b.

An electrical network of wires 35 and a switching system 36 for example routes electrical current from a generator 31 to coils 34 wound about different areas of the core rings 33 to generate localized magnetic filed in selected local areas. The current from the electrical current generator 31 is routed through the controlled switching system 36 and network of wires 35 to the proper coils 34 about the core rings 33 adjacent to the pockets 21. This generates the desired magnetic field at the proper locations in the platen/table 17 to controllably provide the selective magnetic field to the pockets 21 of magnetorheological fluid (MRF) material.

The selective magnetic field, in turn, causes the magnetorheological fluid (MRF) material to become stiff. The stiffness of the magnetorheological fluid (MRF) material provides pad stiffness and increases the removal rate on the wafer. The control in real time of the stiffness in specific areas of the pad 19 provides control of the removal rate of the wafer 13 in that area. The greater the magnetic field the stiffer the pad and the greater the removal rate. As the magnetic field increases, the more the effective modulus increases and effective pad thickness decreases. As a result the interfacial contact stress increases/decreases as a function of the applied magnetic field.

Figure 7:
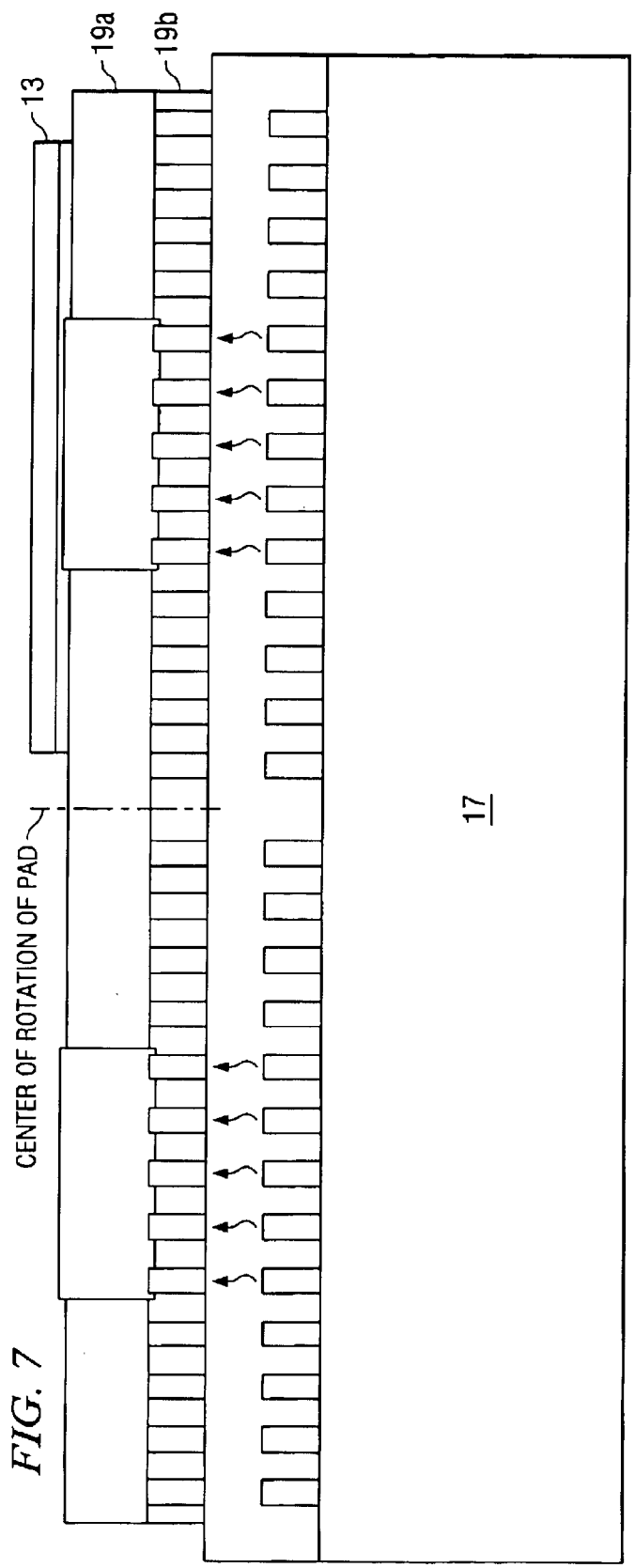
FIG. 7 illustrates selecting the region of stiffness between the center and periphery of the pad to increase the wafer center removal rate.

FIGS. 6 and 7 illustrate changes in regions of higher pad stiffness. FIG. 6 illustrates the field for changes to the magnetorheological fluid (MRF) material in the regions in the center and near the periphery of the pad 19 to add stiffness to these areas. This increases the wafer edge removal rate by increasing the stiffness in these areas of the sub-pad. FIG. 7 illustrates the field for changes to the magnetorheological fluid (MRF) material in the region in the between center and the periphery of the pad to add stiffness to these areas. This increases the wafer center removal rate.

As the magnetic field increases, the effective modulus of the magnetorheological fluid (MRF) fluid increases and effective pad thickness decreases. As a result, the interfacial contact stress increases/decreases as a function of the applied magnetic field. The effective pad modulus and effective pad thickness can be controlled in real time as the response time of magnetorheological fluid (MRF) is on the order of milliseconds. MRF is a fluid of which Theological properties (e.g. viscosity shear modulus, yield stress, etc.) almost instantaneously (1/1000 of a second) change under the externally applied magnetic field.

Figure 8:
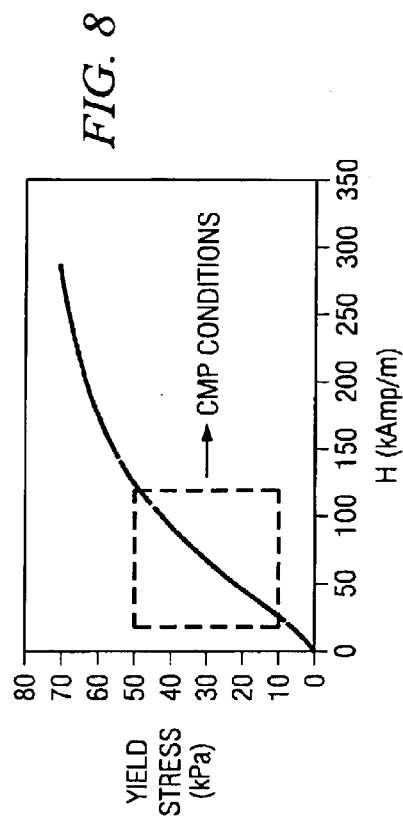
FIG. 8 is a plot of yield stress in kPa versus magnetic field intensity in Henry (kAmp/m) of Lord Corporation's MR fluid.

FIG. 8 is a plot of yield stress versus magnetic field intensity of Lord Corporation's water based MR fluid (MRF-240BS). If, for example, the pressure of the head 11 on the pad 19 is 40 kilopascal (kPa) a magnetic field in Henry or H (kAmp/m) must be sufficient to make solid but also sufficient to overcome the pressure applied to the pad by the polishing head. For the example, a field of greater than 100 Henry (H) and on the order of 150 Henry (H) is required to stiffen the MRF pockets in a polishing pad under the typical pressures applied during polishing. The specific material used is MRF240BS of Lord Corporation of Gary, N.C.

While the preferred embodiment has the top pad 19a integrated with the sub-pad 19b the pads may be separate. Also the magnetic field maybe generated in the pad itself such as by a third layer of hard pad material containing rings of core material and a network of wires that are connected to a generator and switch control box.

While the application described above is CMP polishing semiconductors the subject invention may be used in other polishing applications such as optical lenses.

Although the method an apparatus of the present invention has been described in connection with an embodiment, it is not intended to be limited to the specific form set forth herein, but on the contrary, it is intended to cover such alternatives, modifications, and equivalents, as cn be reasonably included within the spirit and scope of the invention as defined in the appended claims.

What is claimed is:

1. A method of polishing an object comprising the steps of:
   providing a pad for polishing said object having magnetorheological fluid embedded within said pad; and
   applying a selective magnetic field to said magnetorheological fluid to control stiffness of the pad at selective regions to control the polishing of said object with said pad.

2. The method of claim 1 wherein said pad includes a first polishing pad and a sub-pad containing magnetorheological fluid within said sub-pad.

3. The method of claim 1 wherein said pad contains areas of said magnetorheological fluid and said applying step includes applying the magnetic field to selective areas to increase the stiffness of the pad and polishing rate at said selective areas.

4. A CMP polishing apparatus comprising:
    a rotatable platen/table and a polishing pad on the platen/table;
    a polishing head for holding a wafer to be polished and providing pressure of wafer against the polishing pad on the platen/table;
    a sub-pad between the polishing pad and the platen/table for providing
    mechanical support under the polishing pad; said sub-pad containing regions
    or pockets of magnetorheological fluid in said sub-pad for controlling stiffness in real time control of the sub-pad; and
    means for applying a selective magnetic field to selective of said regions or pockets of magnetorheological fluid in the sub-pad to control the stiffness of the sub-pad to provide real time control of the polishing of regions of the wafer being polished.

5. A polishing apparatus for polishing an object comprising:
    a rotatable platen/table and a polishing pad;
    a polishing head for holding an object to be polished and providing pressure of the object against the polishing pad on the platen/table;
    said pad containing regions or pockets of magnetorheological fluid embedded in said pad for controlling the stiffness of the pad; and
    means for applying a selective magnetic field to selective of said regions or pockets of magnetorheological fluid in the pad to control stiffness of the pad to provide real time control of the polishing of regions of the object being polished.

6. The apparatus of claim 5 wherein said pad includes a top pad and a sub-pad and said magnetorheological material is in pockets in said sub-pad.

7. The apparatus of claim 5 wherein said object is a wafer.

8. The apparatus of claim 5 wherein said regions or pockets are arranged in concentric rings about said pad.

9. The method of claim 5 wherein said means for applying a magnetic field includes means within said platen/table for generating a magnetic field.

10. The method of claim 9 wherein said means within said platen/table includes pockets of core material distributed under pockets of magnetorheological fluid in said pad.

11. The polishing apparatus of claim 5 wherein said means for applying a magnetic field includes means within said pad for generating a magnetic field.

12. The polishing apparatus of claim 11 wherein said means within said pad for generating a magnetic field includes said pad including a top pad, a first sub-pad having magnetorheological material embedded in regions or pockets in said first sub-pad and a second sub-pad containing core material located in adjacent areas to magnetorheological material embedded in pockets in said first sub-pad.

13. The polishing apparatus of claim 12 wherein said regions or pockets are arranged in concentric rings about said pad.

14. The polishing apparatus of claim 12 wherein said second sub-pad includes a network of wires that are adapted to be connected to an electrical generator.

15. A method of CMP polishing of a semiconductor wafer comprising the steps of:
    providing a rotatable platen/table and a polishing pad on the platen/table;
    forcing a polishing head holding a wafer against the polishing pad;
    said polishing pad including a sub-pad containing pockets of magnetorheological fluid within said sub-pad; and
    selectively applying magnetic field at said pockets containing magnetorheological fluid to change viscosity of the magnetorheological fluid to control the stiffness of the sub-pad in the areas of the applied magnetic field.

16. An improved polishing pad for polishing an object comprising:
    a top porous polishing pad portion with asperity surface to aid slurry action and a sub-pad portion having pockets of magnetorheological fluid embedded therein for causing stiffness control under a magnetic field.

* * * * *